United States Patent
Timaru et al.

(10) Patent No.: US 6,794,937 B1
(45) Date of Patent: Sep. 21, 2004

(54) PREDISTORTION LINEARIZER AND METHOD FOR LINEARIZING A NONLINEAR DEVICE

(75) Inventors: Theodore Timaru, Plano, TX (US); Kenneth E. Burchfield, Allen, TX (US)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/008,451

(22) Filed: Nov. 30, 2001

(51) Int. Cl.[7] .............................................. H03F 1/26
(52) U.S. Cl. ...................... 330/149; 330/15; 330/158
(58) Field of Search .................................. 330/149, 151, 330/136, 129; 455/114, 126, 235.1, 234.1, 63; 375/296, 297

(56) References Cited

U.S. PATENT DOCUMENTS

| | | | |
|---|---|---|---|
| 5,049,832 A | 9/1991 | Cavers | 330/149 |
| 5,148,448 A | 9/1992 | Karam et al. | 375/60 |
| 5,155,448 A * | 10/1992 | Powell | 330/149 |
| 5,576,660 A | 11/1996 | Pouysegur et al. | 330/149 |
| 5,589,797 A * | 12/1996 | Gans et al. | 330/149 |
| 5,745,006 A | 4/1998 | Budnik et al. | 330/149 |
| 6,016,076 A | 1/2000 | Arell | 330/149 |
| 6,043,707 A | 3/2000 | Budnik | 330/10 |
| 6,112,062 A * | 8/2000 | Hans et al. | 455/114.3 |
| 6,122,085 A | 9/2000 | Bitler | 359/180 |
| 6,211,733 B1 * | 4/2001 | Gentzler | 330/149 |
| 6,255,908 B1 | 7/2001 | Ghannouchi et al. | 330/149 |
| 6,285,254 B1 * | 9/2001 | Chen et al. | 330/149 |
| 6,369,603 B1 * | 4/2002 | Johnston et al. | 324/766 |
| 6,437,644 B1 * | 8/2002 | Kenington | 330/149 |

FOREIGN PATENT DOCUMENTS

EP 0385641 B1 1/1995

OTHER PUBLICATIONS

Kazuhisa Yamauchi et al. "A Microwave Miniaturized Linearizer Using a Parallel Diode with a Bias Resistance", IEEE Transactions on Microwave Theory and Techniques, vol. 45, No. 12, pp. 2431– Dec. 1997.

* cited by examiner

*Primary Examiner*—Michael Tokar
*Assistant Examiner*—Linh V Nguyen
(74) *Attorney, Agent, or Firm*—William J. Tucker; Jessica W. Smith; V. Lawrence Sewell

(57) ABSTRACT

A predistortion linearizer, transmitter and method for linearizing a nonlinear device (e.g., power amplifier, mixer) are described. The predistortion linearizer includes a coupling circuit, a diode and a direct current adjusting circuit that work together to generate a distorted signal which is reflected onto a signal path and inputted into the nonlinear device. The distorted signal compensates for at least some of the nonlinear spurs introduced by the nonlinear device to an input signal which was also applied to the signal path and inputted into the nonlinear device. As a result, the nonlinear device outputs a compensated output signal.

14 Claims, 4 Drawing Sheets

PREDISTORTION LINEARIZER AND METHOD FOR LINEARIZING A NONLINEAR DEVICE

BACKGROUND OF THE INVENTION

1. Field of the Invention

The present invention is directed to the reduction of distortion that is added to a signal by a nonlinear device (e.g., power amplifier, mixer) in a transmitter.

2. Description of Related Art

Transmitters use complex modulation schemes (e.g., 16QAM, 64 QAM, 32TCM, 128TCM) to make efficient use of the available spectrum. However, these complex modulation schemes are very sensitive to all types of distortion and, in particular, to nonlinear types of distortion caused by nonlinear devices (e.g., power amplifiers, mixer) in the transmission chain. Therefore, it is important to reduce the distortion added to a signal by nonlinear devices so that transmitters can use complex modulation schemes and make efficient use of the available spectrum.

It is well known that power amplifiers have nonlinear characteristics, see FIG. 1 which illustrates a Power$_{IN}$-Power$_{OUT}$ graph 100 that shows a linear zone 102 and a saturation zone 104 of a power amplifier. As shown, if the power amplifier is used in the linear zone 102, then the full power of the power amplifier may not be utilized. And, if the power amplifier is used in the saturation zone 104, then the power amplifier unacceptably distorts an input signal. As such, the power amplifier should operate near but not to close to the saturation zone 104. The efficiency of the power amplifier can be increased by extending the linear range of the linear zone 102 into and above the saturation zone 104 (see dashed line). A nonlinear correction device known as a linearizer can be used to increase the efficiency of the power amplifier. There are many different types of linearizers used today including feedback linearizers and feedforward linearizers. Examples of a traditional feedback linearizer and a traditional feedforward linearizer are briefly discussed below with respect to FIGS. 2 and 3.

Referring to FIG. 2 (PRIOR ART), there is shown a block diagram of a transmitter 200 incorporating a traditional feedback linearizer 202. Certain details associated with the transmitter 200 such as a modulator, filter and mixer are well known in the industry and as such need not be described herein. Therefore, for clarity, the description provided below in relation to the transmitter 200 omits the components not necessary to understand the invention.

The transmitter 200 receives an undistorted input signal 204 at an input terminal 206 that is processed by a subtractor 208 and amplified to a higher power level by a power amplifier 210 which generates an output signal 212 that is transmitted by an antenna 214. As described above, the power amplifier 210 imparts some distortion (e.g., nonlinear components, nonlinear spurs) to the input signal 204 which without the presence of the feedback linearizer 202 would be present in the output signal 212. To help compensate for the distortion, a portion of the output signal 212 is applied to a voltage divider 216 which outputs a lower powered signal 216. The lower powered signal 218 is applied to the subtractor 208. In the subtractor 208, the lower powered signal 218 which is 180° out of phase with the input signal 204 is added to the input signal 204 which helps to compensate for the nonlinearities that are going to be added by the power amplifier 210 to the input signal 204. As such, the feedback linearizer 202 including the subtractor 208 and the voltage divider 216 helps to compensate for at least some of the distortion that is going to be added to the input signal 204 by the power amplifier 210. Essentially, the traditional feedback linearizer 202 relies on a feedback loop to compensate for the nonlinearities produced by the power amplifier 210.

A main drawback of the traditional feedback linearizer 202 is that only a limited amount of correction can be achieved with this arrangement. Because, the delay associated with the feedback loop limits the effectiveness of the feedback linearizer 202. In practice, the traditional feedback linearizer 202 is difficult to implement and often become unstable in transmitters that operate at higher frequencies (e.g., 2 GHz–11 GHz).

Referring to FIG. 3 (PRIOR ART), there is shown a block diagram of a transmitter 300 incorporating a traditional feedforward linearizer 302. Again, certain details associated with the transmitter 300 such as a modulator, filter and mixer are well known in the industry and as such need not be described herein. Therefore, for clarity, the description provided below in relation to the transmitter 300 omits the components not necessary to understand the invention.

The transmitter 300 receives an undistorted input signal 304 (see exploded view where signal 304 includes two tones) at an input terminal 306 which is split by a splitter 308 and input into a power amplifier 310 and a time delay circuit 312. The power amplifier 310 amplifies one portion of the input signal 304 and outputs a distorted signal 314. The time delay circuit 312 delays the other portion of the input signal 304 and outputs a delayed signal 316. The delayed signal 316 has the same phase as the distorted signal 314. The distorted signal 314 is then stepped downed and forwarded by a coupler 318 to an input of a subtractor 320 that also receives the delayed signal 316 and outputs a nonlinear signal 322. In effect, the subtractor 320 cancels the main signals 324 of the distorted signal 314 and the delayed signal 316 such that only the nonlinear spurs 326 remain which form the nonlinear signal 322. The nonlinear signal 322 is amplified by an error power amplifier 328 which outputs a distorted nonlinear signal 330. It should be noted that the error power amplifier 328 has the same characteristics as power amplifier 310. At the same time, another time delay circuit 332 delays the distorted signal 314 and outputs a delayed distorted signal 334. The delayed distorted signal 334 has the same phase as the distorted nonlinear signal 330. The nonlinear distorted signal 330 is then stepped up and forwarded by a coupler 336 to an input of another subtractor 338 that also receives the delayed distorted signal 334 and outputs a compensated signal 340. The compensated signal 340 has the same main signals 324 and smaller nonlinear spurs 326 when compared to the distorted signal 314. The compensated signal 340 is transmitted by an antenna 342.

A main drawback of the traditional feedforward linearizer 302 is that it is a complex system in that it is difficult to tune the time delay circuits 312 and 332, the couplers 318 and 336, the power amplifiers 310 and 328 and the subtractors 320 and 338. Another drawback of the traditional feedforward linearizer 302 is that it is expensive to make and difficult to implement in transmitters that operate at higher frequencies (e.g., 2 GHz–11 GHz). Accordingly, there has been a need for a linearizer that can address the aforementioned problems and other problems associated with traditional linearizers. These needs and other needs are addressed by the predistortion linearizer and method of the present invention.

BRIEF DESCRIPTION OF THE INVENTION

The present invention includes a predistortion linearizer, transmitter and method for linearizing a nonlinear device (e.g., power amplifier, mixer). Basically, the predistortion linearizer includes a coupling circuit, a diode and a direct current adjusting circuit that work together to generate a distorted signal which is reflected onto a signal path and inputted into the nonlinear device. The distorted signal compensates for at least some of the nonlinear spurs introduced by the nonlinear device to an input signal which was also applied to the signal path and inputted into the nonlinear device. As a result, the nonlinear device outputs a compensated output signal.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Referring to FIGS. 4–8, there is disclosed a preferred embodiment of a transmitter 400, a predistortion linearizer 402 and a method 700 in accordance with the present invention. Although the predistortion linearizer 402 is described being incorporated within a transmitter 400, it should be understood that the predistortion linearizer 402 can be used in any type of electronic device. Accordingly, the transmitter 400, predistortion linearizer 402 and method 700 should not be construed in a limited manner.

Figure 4:
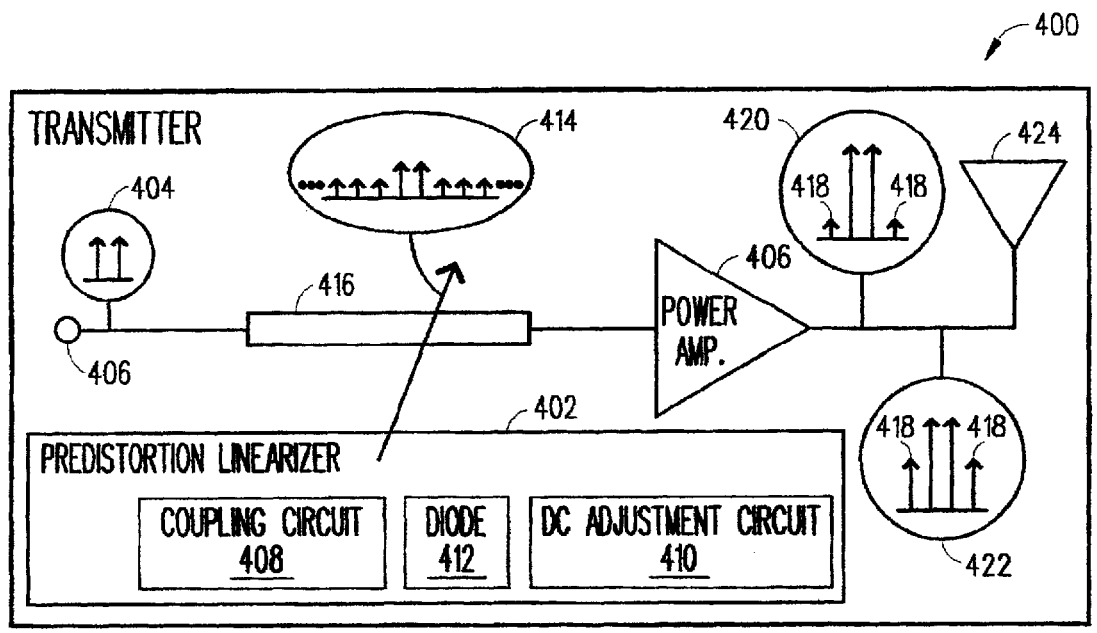
FIG. 4 is a block diagram of a transmitter incorporating a predistortion linearizer in accordance with the present invention.

Referring to FIG. 4, there is illustrated a block diagram of the transmitter 400 incorporating the predistortion linearizer 402. Certain details associated with the transmitter 400 such as a modulator, filter and mixer are well known in the industry and as such need not be described herein. Therefore, for clarity, the description provided below in relation to the transmitter 400 omits the components not necessary to understand the invention.

The predistortion linearizer 402 basically operates to distort the shape (e.g., magnitude, phase) of an input signal 404 (see exploded view) so as to compensate for distortion that is going to be added to the input signal 404 when it is amplified by a power amplifier 406. The predistortion linearizer 402 includes a coupling circuit 408, a direct current (DC) adjustment circuit 410 and a diode 412 that work together to generate a distorted signal 414 (see exploded view) which is applied to a signal path 416 and inputted into the power amplifier 406. The input signal 404 is also input to the power amplifier 406. The distorted signal 414 has a different shape (e.g., phase, magnitude) than the input signal 404. The distorted signal 414 effectively compensates for at least some of the nonlinear spurs 418 (e.g., nonlinear components, intermodulation products (IM3)) that are going to be added to the input signal 404 when it is amplified by the power amplifier 406. In other words, the predistortion linearizer 402 enables the power amplifier 406 to generate a compensated output signal 420 (see exploded view) that is transmitted by an antenna 424. Compare the compensated output signal 420 to a non-compensated output signal 422 (see exploded view) that would have been generated by the power amplifier 406 if the predistortion linearizer 402 was not used.

Figure 5:
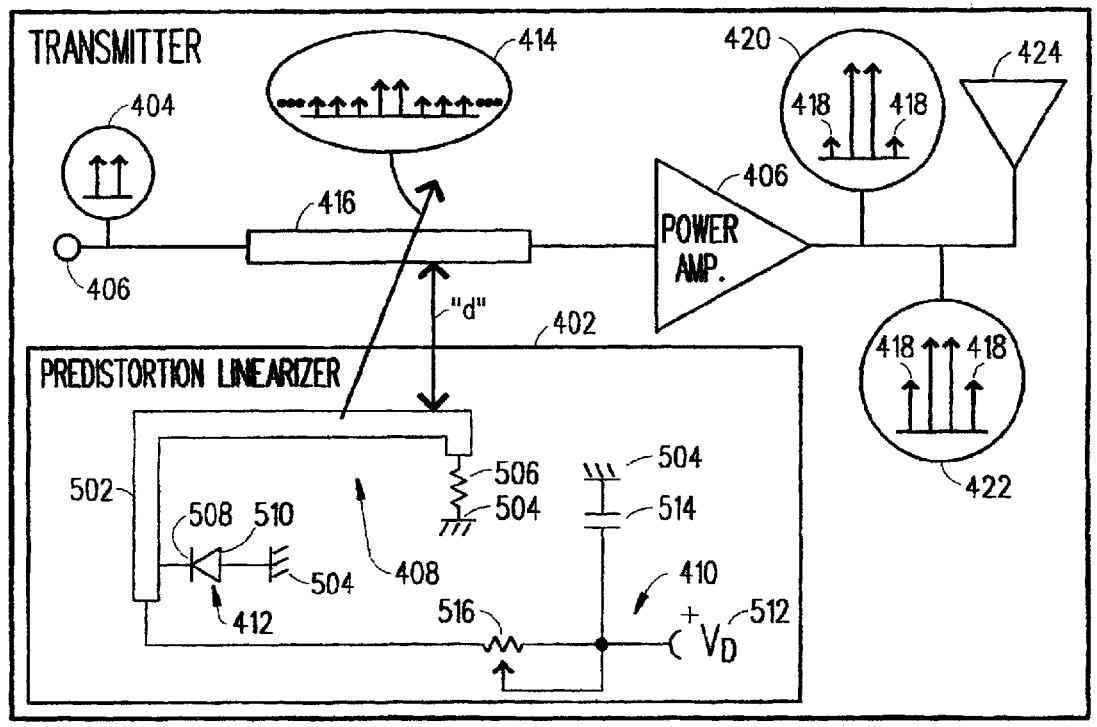
FIG. 5 is a block diagram illustrating in greater detail the components of the predistortion linearizer shown in FIG. 4.

Referring to FIG. 5, there is a block diagram illustrating in greater detail the components of the predistortion linearizer 402. As described above, the predistortion linearizer 402 includes the coupling circuit 408, the DC adjustment circuit 410 and the diode 412. The coupling circuit 408 includes a microstrip 502 that at one end is connected to ground 504 through a resistor 506 and at another end is connected to a cathode 508 of the diode 412. The anode 510 of the diode 412 is connected to ground 504. The DC adjustment circuit 410 includes a DC voltage source 512 that is connected to one end of a capacitor 514 and to one end of an adjustable resistor 516. The other end of the capacitor 514 is connected to ground 504 and the other end of the adjustable resistor 516 is connected to the microstrip 502 and the cathode 508 of the diode 412. In the preferred embodiment, the predistortion linearizer 402 is physically located very close to the signal path 416 and in front of the power amplifier 406 (or other nonlinear device). In other words, the predistortion linearizer 402 is coupled to the signal path by means of a directional coupler circuit.

In operation, the coupling circuit 410 is capable of introducing a relatively small amount of power from the input signal 404 on the signal path 416 into the diode 412. The amount of power introduced into the diode 412 from the input signal 404 is related to the shape of the microstrip 502 and the distance "d" the microstrip 502 is located from the signal path 416. The shape of the microstrip 502 and the distance "d" between the microstrip 502 and the signal path 416 are determined during a tuning process which is described in greater detail below.

Upon receiving the power from the input signal 404 and also receiving DC current from the DC adjustment circuit 410, the diode 410 generates the distorted signal 414. The coupling circuit 408 reflects the distorted signal 414 back onto the signal path 416 and into the power amplifier 406. After which, the power amplifier 406 generates the compensated output signal 420 which has nonlinear spurs 418 that are less in magnitude when compared to the magnitude of nonlinear spurs 418 in the non-compensated output signal 422. Again, the non-compensated signal 422 would have been generated by the power amplifier 406 if the predistortion linearizer 402 was not used.

It should be noted that the shape (e.g., magnitude, phase) of the distorted signal 414 and as such the shape of the compensated output signal 420 is directly related to the amount of direct current inputted into the diode 412 by the DC adjustment circuit 410. In particular, the amount of direct current outputted by the DC adjustment circuit 410 has a direct effect on the magnitudes and phases of the nonlinear spurs 418 in the distorted signal 414 generated by the diode 412. A brief discussion on how the diode 412 is able to generate the distorted signal 412 is provided below with respect to FIG. 6.

Figure 1:
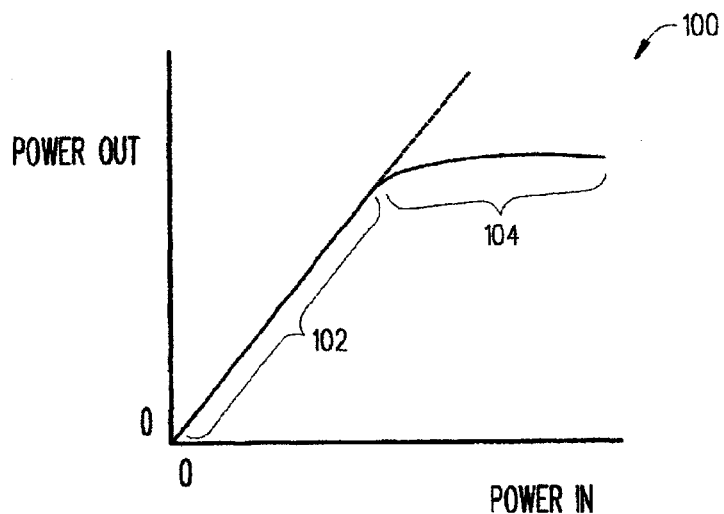
FIG. 1 (PRIOR ART) is a graph illustrating the Power$_{IN}$-Power$_{OUT}$ relationship of a traditional power amplifier.
Figure 2:
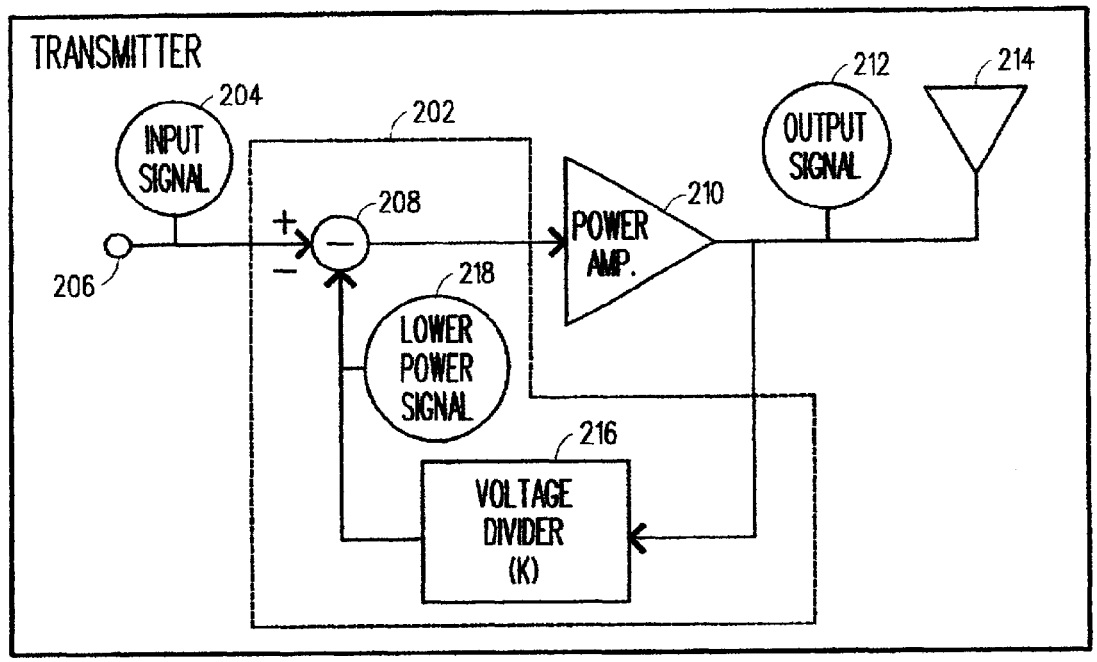
FIG. 2 (PRIOR ART) is a block diagram of a transmitter incorporating a traditional feedback linearizer.
Figure 3:
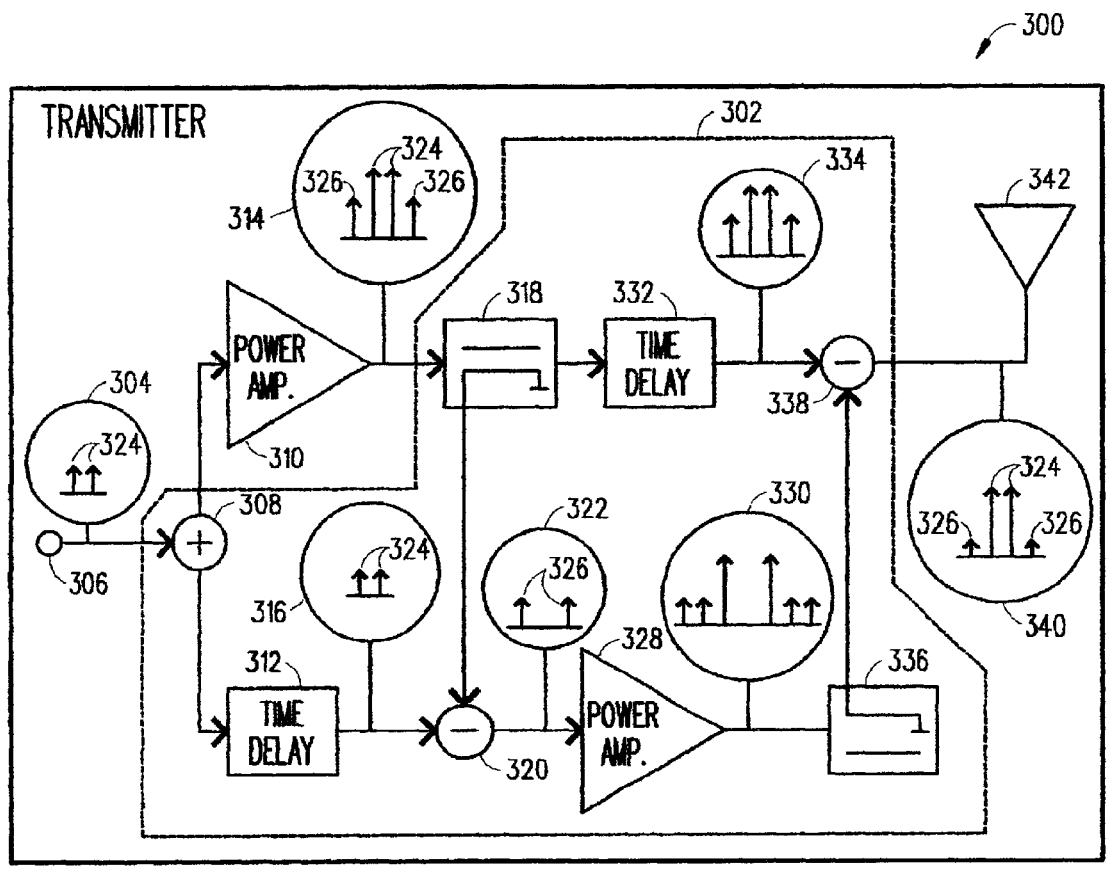
FIG. 3 (PRIOR ART) is a block diagram of a transmitter incorporating a traditional feedforward linearizer.
Figure 6:
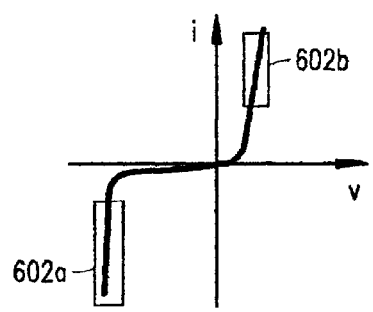
FIG. 6 is a graph illustrating the current-to-voltage relationship of a diode in the predistortion linearizer shown in FIG. 4.

Referring to FIG. 6, there is a graph illustrating the current-to-voltage relationship of the diode 412 in the predistortion linearizer 402. Basically, the diode 412 functions as a nonlinear device and generates the distorted signal 414 when it is operating in a reverse bias region (e.g., breakdown region) 602a or a forward bias region 602b. In the preferred embodiment, the diode 412 operates in the reverse bias region 602a because the cathode 508 is connected to a positive voltage (see FIG. 4). However, the diode 412 could just a well operate in the forward bias region 602b if the anode 510 was connected to the positive voltage (not shown).

The designer can determine which region 602a or 602b the diode 412 should operate in so as to generate the "best" distorted signal 414. The design process is where the designer determines which shape (characteristics of) the distorted signal 414 should have to "best" compensate for the nonlinearities added to the input signal 404 by the power amplifier 406. There are several factors that can affect the shape (characteristics) of the distorted signal 414 generated by the diode 412 including (for example):

- The type of diode 412 used in the predistortion linearizer 402. Different types of diodes include, for example, Schottky diodes, Anti-Parallel diodes, Schottky Barrier diodes and Pin diodes.
- The orientation of the diode 412. Does the diode 412 operate "best" in the reverse bias region 602a or the forward bias region 602b.
- The frequency of the input signal 404.
- The type of power amplifier 406.
- The amount of direct current supplied to the diode 412 by the direct current adjustment circuit 410.
- The shape of the microstrip 502 and the distance "d" the microstrip 502 is located from the signal path 416 leading into the power amplifier 406. It should be noted that distance "d" determines the coupling factor and the coupling factor can be adjusted by using coupling tuning chips (metalized ceramic tabs) or variable capacitors.

Typically, the designer manually performs the tuning process to determine how to make the predistortion linearizer 402 generate the "best" distorted signal 414. It can be difficult to determine how to make the predistortion linearizer 402 generate the "best" distorted signal 414, since when the designer changes one of the aforementioned factors that can have an effect on one or more of the other aforementioned factors. For instance, if the designer changes the type of diode 412 then the shape of the microstrip 502 may need to be changed and the amount of direct current supplied to the diode 412 may need to be changed in order to generate the "best" distorted signal 414. To help perform the tuning process, the coupling circuit 408 and the direct current adjustment circuit 410 can be automatically adjusted to help determine the "best" shape or to optimize the shape of the distorted signal 414. Of course, the designer completes the tuning process before manufacturing the transmitter 400.

Figure 7:
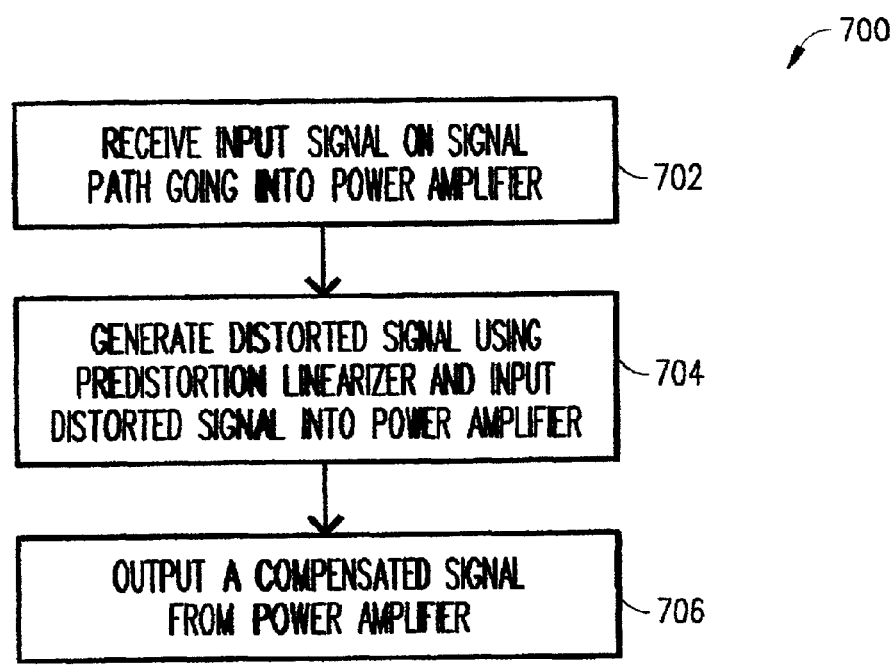
FIG. 7 is a flowchart illustrating the basic steps of a preferred method for linearizing a nonlinear device in accordance with the present invention.

Referring to FIG. 7, there is a flowchart illustrating the basic steps of the preferred method 700 for linearizing a nonlinear device (e.g., mixer, power amplifier 406). Beginning at step 702, the power amplifier 406 receives the input signal 404 on the signal path 416. Even though the power amplifier 406 is described herein as being incorporated within the transmitter 400, it should be understood that the power amplifier 406 can be used in any type of electronic device.

At step 704, the predistortion linearizer 402 using the diode 412 generates the distorted signal 414 which is applied to the signal path 416 and inputted into the power amplifier 406. A detailed description on how the predistortion linearizer 402 can generate the distorted signal 414 is provided below with respect to FIG. 8.

Figure 8:
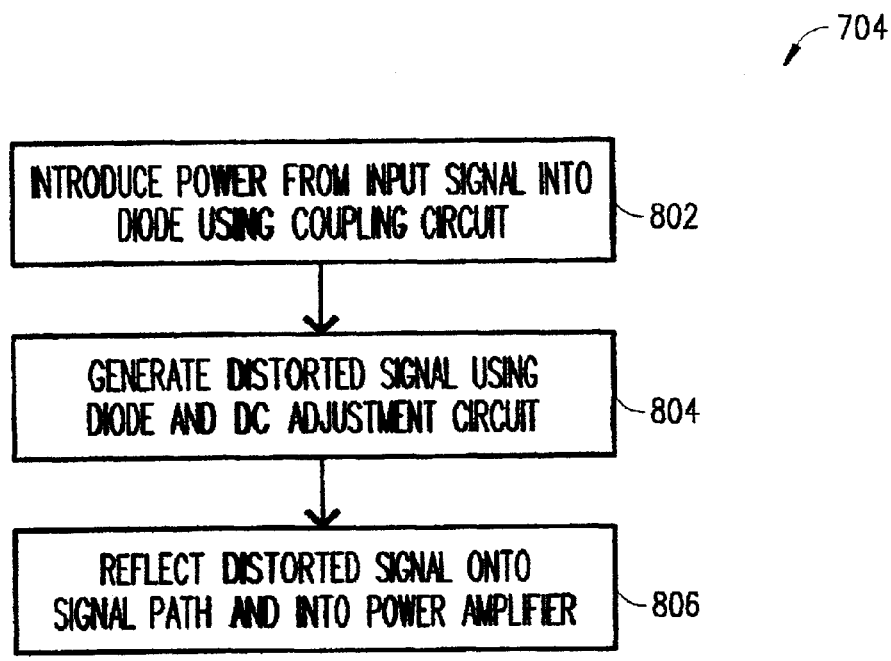
FIG. 8 is a flowchart illustrating in greater detail the steps of the generating operation of the method shown in FIG. 7.

Referring to FIG. 8, there is a flowchart illustrating in greater detail the steps associated with the aforementioned generating step 704. At step 802, the predistortion linearizer 402 using the coupling circuit 408 introduces a relatively small amount of power from the input signal 404 into the diode 412. The amount of power introduced from the input signal 404 into the diode 412 by the coupling circuit 408 is related to the shape of the microstrip 502 and the distance "d" the microstrip 502 is located from the signal path 416. As described above, the shape of the microstrip 502 and the distance "d" between the microstrip 502 and the signal path 416 is determined during the tuning process.

At step 804, the predistortion linearizer 402 using the diode 412 generates the distorted signal 414. As described above, the diode 412 functions as a nonlinear device when it is operating in one of the regions 602a or 602b and as such generates the distorted signal 414. In particular, the diode 412 can generate a distorted signal 414 that has nonlinear spurs. To make the predistortion linearizer 402 generate the "best" distorted signal 414, the designer has to tune the predistortion linearizer 402. Again, there are several factors that can affect the shape of the distorted signal 414 generated by the diode 412 including (for example):

- The type of diode 412 used in the predistortion linearizer 402. Different types of diodes include, for example, Schottky diodes, Anti-Parallel diodes, Schottky Barrier diodes and Pin diodes.
- The orientation of the diode 412. Does the diode 412 operate "best" in the reverse bias region 602a or the forward bias region 602b.
- The frequency of the input signal 404.
- The type of power amplifier 406.
- The amount of direct current supplied to the diode 412 by the direct current adjustment circuit 410.
- The shape of the microstrip 502 and the distance "d" the microstrip 502 is located from the signal path 416 leading into the power amplifier 406. Again, it should be noted that distance "d" determines the coupling factor and the coupling factor can be adjusted by using coupling tuning chips (metalized ceramic tabs) or variable capacitors.

At step 806, the predistortion linearizer uses the coupling circuit 408 to reflect the distorted signal 414 generated by the diode 412 back onto the signal path 416 and into the power amplifier 406.

Referring back to FIG. 7, at step 706, the power amplifier 406 outputs the compensated signal 420. As described above, the distorted signal 414 effectively compensates for at least some of the nonlinear spurs 418 (e.g., nonlinear components, intermodulation products (IM3)) that are going to be added to the input signal 404 when it is amplified by the power amplifier 406. In other words, the power amplifier 406 generates the compensated output signal 420 which has nonlinear spurs 418 that are less in magnitude when compared to the magnitude of nonlinear spurs 418 in the non-compensated output signal 422. Again, the non-compensated signal 422 would have been generated by the power amplifier 406 if the predistortion linearizer 402 was not used.

It should be noted that the predistortion linearizer 402 does not physically contact the signal path 416 or the power amplifier 406. As such, the predistortion linearizer 402 does not affect the signal path 416 nor does the predistortion linearizer 402 affect the operation of the power amplifier 406.

Following are some other advantages, features and capabilities of the present invention:

The predistortion linearizer 402 can work in any type of transmitter 400 (e.g., radio, cell phone, base station).

The predistortion linearizer 402 can be effectively implemented in wireless systems operating at or above 2 GHz.

The predistortion linearizer 402 can be used in a variety of products including, for example, Point-to-Point Communication Systems, Point-to-Multipoint Communication Systems and PCS Systems.

The predistortion linearizer 402 can be used to help correct the nonlinearities of different radio systems and consequently improve the overall features of the radio system including, for example, system gain and power efficiency.

Although one embodiment of the present invention has been illustrated in the accompanying Drawings and described in the foregoing Detailed Description, it should be understood that the invention is not limited to the embodiment disclosed, but is capable of numerous rearrangements, modifications and substitutions without departing from the spirit of the invention as set forth and defined by the following claims.

What is claimed is:

1. A circuit for amplifying a signal, comprising:
   a power amplifier having an input signal path and an output signal path; and
   a predistortion linearizer circuit that comprises:
      a circuit for generating a distorted signal;
      a coupling circuit, coupled to the circuit for generating a distorted signal, wherein the coupling circuit is capable of introducing a relatively small amount of power from the input signal into the circuit and further capable of reflecting the distorted signal generated by the circuit back onto the input signal path without being physically coupled to the input signal path, and wherein the coupling circuit includes a microstrip having a predefined shape and located a predetermined distance from the signal path leading into the power amplifier such that the relatively stroll amount of power from the input signal is related to the predefined shape of the microstrip and the predetermined distance from the signal path.

2. The circuit of claim 1 wherein the circuit for generating a distorted signal comprises:
   a diode with an input for receiving the relatively small amount of power from the coupling circuit; and
   a direct current adjustment circuit, coupled to the diode, capable of adjusting an amount of direct current inputted into the diode.

3. The circuit of claim 2, wherein said diode is a Schottky diode.

4. The circuit of claim 3, wherein the predefined shape of the microstrip, the predetermined distance from the signal path of the microstrip and said direct current adjustment circuit are manually adjusted to optimize a shape of the distorted signal.

5. A predistortion linearizer for use with a nonlinear device, said predistortion linearize comprising:
   a coupling circuit capable of receiving a relatively small amount of power from an input signal on a signal path that is connected to the nonlinear device and for reflecting a distorted signal back onto the input signal path, wherein said coupling circuit is located a distance from the signal path and not physically coupled with the signal path;
   a diode coupled to said coupling circuit, capable of receiving the relatively small amount of power from the coupling circuit and generating the distorted signal in response to the relatively small amount of power;
   a direct current adjustment circuit, coupled to said diode, capable of adjusting the amount of direct current inputted into said diode; and
   wherein the distorted signal generated by the diode is adjusted to compensate for nonlinear spurs in an output of the nonlinear device by modifying the distance of the coupling circuit firm the signal path.

6. The predistortion linearizer of claim 5, wherein the distorted signal is adjusted to compensate for nonlinear spurs in an output of the nonlinear device by adjusting the distance of the coupling circuit from the signal path and adjusting the amount of direct current inputted into said diode.

7. The predistortion linearizer of claim 6, wherein the coupling circuit is a microstrip.

8. The predistortion linearizer of claim 7, wherein the distorted signal is adjusted to compensate for nonlinear spurs in an output of the nonlinear device by adjusting the distance of the coupling circuit from the signal path, adjusting the amount of direct current inputted into said diode and adjusting a shape of the microstrip.

9. The predistortion linearizer of claim 5, wherein the type of diode used depends on the frequency of the input signal.

10. The predistortion linearizer of claim 5, wherein said diode does not affect the signal path or the operation of the nonlinear device.

11. The predistortion linearizer of claim 5, wherein said nonlinear device and said diode are incorporated within a transmitter operating at or above 2 GHz.

12. A method for linearizing a nonlinear device, said method comprising the steps of:
   receiving, at the nonlinear device, an input signal on a signal path;
   generating a distorted signal which is reflected onto the signal path by a coupling circuit and inputted into the nonlinear device, wherein the coupling circuit is not physically connected to the signal path;
   outputting, from the nonlinear device, a compensated signal, wherein the distorted signal compensates for at least some of the nonlinear spurs introduced to the input signal by the nonlinear device; and
   wherein the distorted signal may be adjusted to better compensate for at least some of the nonlinear spurs by adjusting a coupling factor between the coupling circuit and the signal path.

13. The method of claim 12, for linearizing a nonlinear device, wherein adjusting a coupling factor between the coupling circuit and the signal path comprises adjusting a distance d between the coupling circuit and the signal path.

14. The method of claim 13 for linearizing a nonlinear device, wherein adjusting a coupling factor between the coupling circuit and the signal path comprises adjusting a distance d between the coupling circuit and the signal path and a shape of the coupling circuit.

* * * * *